INVENTORS
FRED BARSON
RICHARD T. KUEHN
MYRON D. PALMER

BY Harry M Weiss
ATTORNEY

United States Patent Office 3,518,084

Patented June 30, 1970

3,518,084
METHOD FOR ETCHING AN OPENING IN AN INSULATING LAYER WITHOUT FORMING PINHOLES THEREIN

Fred Barson, Wappingers Falls, Richard T. Kuehn, Stormville, and Myron D. Palmer, Pleasant Valley, N.Y., assignors to International Business Machines Corporation, Armonk, N.Y., a corporation of New York Filed Jan. 9, 1967, Ser. No. 607,923
Int. Cl. G03c 5/00, 5/06
U.S. Cl. 96—36.2 9 Claims

ABSTRACT OF THE DISCLOSURE

This method uses a double masking layer that is provided, preferably of photoresist material, on the insulating layer that an opening is to be etched therethrough to permit access to either an underlying metal land for electrical contact thereto or a semiconductor substrate for either electrical contact thereto or for diffusion therein. The double masking layer when used with two separate masks prevents undesired or accidental pinhole formation in the insulating layer. Additionally, the use of an enlarged opening or openings in the upper masking or photoresist layer permits control of tolerance errors.

THE DISCLOSURE BACKGROUND

Field of the invention

This invention relates generally to a method for etching an opening in an insulating layer without forming pinholes therein and, more particularly, relates to a method for etching openings in an insulating layer located on a semiconductor substrate to permit access to either an underlying metal land for electrical contact thereto or a semiconductor substrate for either electrical contact thereto or for diffusion therein.

Description of the prior art

In the formation of semiconductor devices, it is generally the customary practice to form desired openings in an insulating layer, such as silicon oxide for silicon semiconductor devices, to permit subsequent diffusion or metallization operations to be performed to the exposed regions located beneath the openings. This practice is also carried out where electrical contact is to be made to a metal land pattern formed between the two insulating layers located on a semiconductor substrate. It is necessary, in this latter case, to form an opening in the upper insulating layer to permit a metal connection to be made to the sandwiched metal land pattern. In these operations where an opening or openings had to be formed in an insulating layer, it was necessary to provide a masking layer on the surface of the insulating layer which served to mask all but the selected region of the insulating layer that an opening was to be made therethrough. In conventional semiconductor etching practices, the masking layer usually was a layer of photoresist, such as Kodak Photo Resist, which is a trade name specifying a photoresist material produced and sold by the Eastman Kodak Company. U.S. Pat. 3,122,817 to Andrus illustrates and describes this practice with respect to the fabrication of semiconductor devices.

One disadvantage associated with this well known technique of forming openings in an insulating layer using a masking layer of photoresist on the surface thereof was that imperfections caused by (a) defects in the photoresist, (b) contaminants on the surface of the insulating layer which caused undesired pinhole openings in the photoresist, or (c) small errors or imperfections in the mask used to develop a pattern on the photoresist layer caused pinhole openings to be formed in the insulating layer during the subsequent etching operation. Consequently, for example, when diffusion operations were performed after the openings were made in the insulating layer, the pinhole openings that were undesirably formed in the photoresist layer and the insulating layer caused undesired diffusion regions to be formed in the semiconductor surface beneath the pinholes in the insulating layer. The formation of these undesired diffused regions results in either electrical shorting or distortion of the electrical characteristics of the semiconductor device or integrated circuit. In the formation of discrete or individual devices in a conventional semiconductor wafer, approximately one inch in diameter, this problem is not of paramount significance since those semiconductor devices, which had undesired diffused regions formed therein due to the pinholes in the insulating layer, could be discarded and the resultant yield would still be substantial. However, in the formation of monolithic semiconductor structures, a single pinhole in an insulating layer on the integrated semiconductor chip could result in the electrical destruction or distortion of the entire monolithic structure due to an undesired diffused region that would be formed in the monolithic integrated chip. Presently, monolithic integrated semiconductor chips may have as many as from one to more than sixty electrical circuits which require a large number of semiconductor components and hence, a number of pinholes in an insulating layer formed on a semiconductor wafer substantially reduces the yield for the number of monolithic chips that could be made from the wafer.

Similarly, in the formation of an electrical metal contact which had to either make ohmic contact to a semiconductor surface beneath an insulating layer or a low resistance contact to a metal land beneath an insulating layer it is necessary to avoid pinholes in the insulating layer since these pinholes would create undesirable shorts to either the semiconductor surface or the metal land beneath the insulating layer. The control of these shorts is equally important in the fabrication of monolithic integrated semiconductor devices or chips in order to improve overall yield of these structures.

Accordingly, it is an object of this invention to provide an improved method for forming openings in an insulating layer while preventing undesirable pinholes from being formed in the insulating layer.

It is a further object of this invention to provide a method for forming an opening in an insulating layer while preventing undesirable pinholes from being formed therein so as to permit a subsequent diffusion operation for semiconductor device fabrication.

Still another object of this invention is to provide a method for forming an opening in an insulating layer while preventing undesirable pinholes from being formed therein so as to permit a low resistance contact metal to electrically contact a metal land located beneath the opening in the insulating layer.

It is still another object of this invention to provide a method for forming an opening in an insulating layer while preventing undesirable pinholes from being formed therein so as to permit the formation of a low resistance ohmic contact to the semiconductor surface located beneath the opening in the insulating layer.

SUMMARY OF THE INVENTION

In accordance with one embodiment of this invention, a method of forming an opening in a film is described which comprises the step of applying a photosensitive layer on the surface of the film. A latent image is formed on the photosensitive layer using a first mask. Using a second mask, a substantially identical latent image is formed on the photosensitive layer. By photoresist techniques, for example, an opening is developed defined by the composite latent image on the photosensitive layer. An opening is then formed in the film thorugh the opening in the photosensitive layer.

Alternatively, two photosensitive layers are deposited, in succession, on the film and by using a different mask to form substantially the same latent image on each layer, an opening can be formed through both photosensitive layers with or without the development of an opening in the first photoresist layer.

In accordance with another embodiment of this invention, a method is described for either forming at least one diffused region in an insulator coated structure, or for forming at least one electrical contact to a structure coated with an insulator. The method comprises applying a first photoresist layer on the surface of the insulator coating. By using a first mask, at least one opening is formed in the first photoresist layer. A second photoresist layer is applied on the first photoresist layer. By using a second mask, at least one opening is formed in the second photoresist layer over the previously formed opening in the first photoresist layer. An opening is formed in the insulator coating through the openings formed in the second and first photoresist layers. Either a diffused region can be formed in the structure by diffusing impurities through the opening in the insulator coating or electrical contact can be made to the structure by depositing a metal layer on the insulator coating thereby making electrical contact through the opening in the insulator coating to the structure.

The foregoing and other objects, features and advantages of the invention will be apparent from the following more particular description of the preferred embodiments of the invention, as illustrated in the accompanying drawings.

DESCRIPTION OF THE PREFERRED EMBODIMENT

Figures 1, 2:
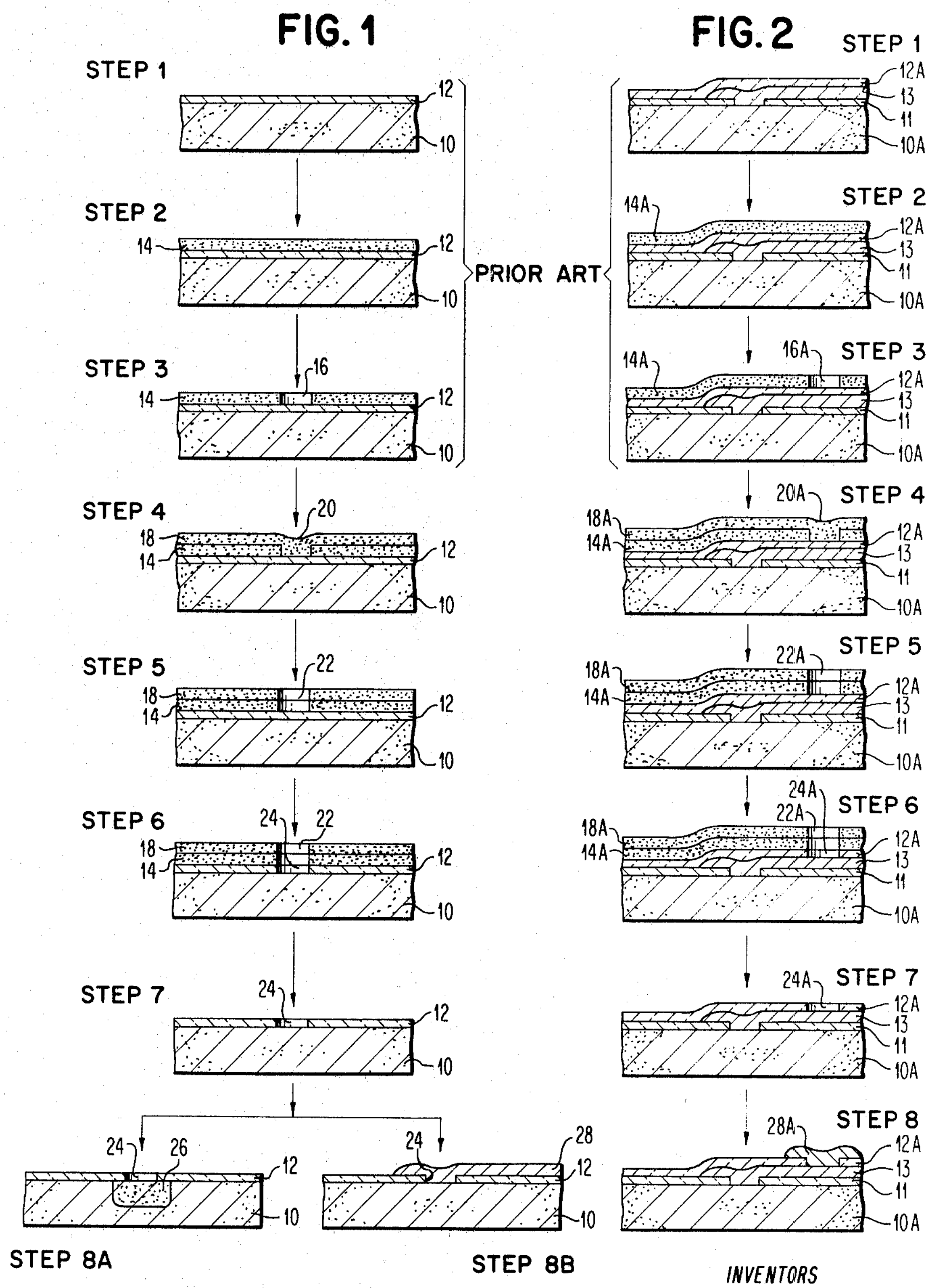
FIG. 1 is a flow diagram showing the steps, in cross-section, for fabricating an opening in an insulating layer located on a semiconductor substrate while preventing pinholes therein in accordance with one embodiment of this invention.
FIG. 2 is a flow diagram showing the steps, in cross-section, for fabricating an opening in an insulating layer located on a metal land while preventing pinholes therein in accordance with another embodiment of this invention.

Referring to FIG. 1, step 1 depicts a seminconductor substrate 10 having an insulating layer 12 on one surface thereof. For example, the semiconductor substrate 10 can be silicon, germanium, or any of the intermetallic compounds well known in the semiconductor art. The insulating layer 12 can be made of any well known insulating material, such as silicon oxide, germanium oxide, silicon nitride, alumina, etc., that can be formed on the substrate surface by conventional deposition or thermal growth techniques. Preferably, the semiconductor substrate 10 is silicon and the insulating layer 12 is silicon dioxide that is thermally grown on the surface of the silicon substrate 10. The remainder of the specification is directed to these preferred materials only for the purpose of simplifying describing the invention, but it should be evident that other materials can be substituted that are functionally equivalent.

In step 2, a masking layer 14 is formed on the insulator 12. Preferably, the masking layer 14 is a photoresist, such as Kodak Photoresist which is a trade name of the Eastman Kodak Company. The application of this layer of photoresist is by conventional spinning and drying techniques. The photoresist material is applied to the surface of the silicon dioxide layer 12 and, after a spinning operation to uniformity smooth out the photoresist layer, a drying operation is carried out to dry the photoresist layer into a uniform, continuous film.

In step 3, as is well known in the prior art as shown and described in U.S. Pat. 3,122,817 to Andrus, an opening 16 is formed in the photoresist layer 14 by a photolithographic masking, exposing, and removal process.

In step 4, a second masking or photoresist layer 18 is formed on the first photoresist layer 14. The second photoresist layer 18 is formed by the same techniques described above with respect to the formation of the first photoresist layer 14. However, the second photoresist layer 18 has a recessed portion 20 located directly above the region in the photoresist layer 14 which identifies the location of the opening that was previously formed therein.

In step 5, an opening 22 is formed in the first and second photoresist regions by using a photolithographic masking, exposing, and removal process. However, a different mask is used in this step than was used in step 3 in order to avoid the repetition of pinhole defects that might be present in the mask used in step 3. The use of the double layer of photoresist 14 and 18 prevents any pinholes that are formed in the second photoresist layer 18 by pinhole defects in the second mask to be of any consequence since these pinhole openings in the second photoresist layer 18 will probably not, statistically, line up with any possible pinholes that were formed in the first photoresist layer 14. In this manner, only opening 22 is formed in photoresist layers 14 and 18 and there will probably not be any pinhole openings formed directly through both of these photoresist layers.

In step 6, using for example a buffered HF solution, an opening 24 is etched in the silicon dioxide layer 12 using the double layers of photoresist 14 and 18 as masking layers. Any undesired pinhole openings that were formed in the second or top photoresist layer 18 are not of any consequence since the buffered HF solution will not attack the underlying first photoresist layer 14.

In step 7, a sectional view is shown after the first and second photoresist layers 14 and 18 have been stripped away by conventional photoresist stripping techniques leaving the opening 24 in the oxide layer 12.

At this point in the semiconductor fabrication process, if the opening 24 was formed for the purpose of creating a diffused region in the semiconductor substrate 10 beneath the opening 24, then a diffusion operation is carried out as shown in step 8A, using conventional diffusion techniques, to form either an N or P type diffused region 26 in the semiconductor substrate 10. The diffused region 26 can be used as a collector, base, or emitter region or even as an isolation or inversion preventing region as is well known in the art. Hence, this process permits the formation of a specifically defined diffused region in the semiconductor substrate 10 with practically no chance of forming other diffused regions in the semiconductor substrate 10 which can occur if there were pinholes in the silicon dioxide layer 12 formed by pinhole openings in a single photoresist masking layer.

Alternatively, if it is desired to form a metal contact to the surface of the semiconductor substrate 10 through the opening 24 (step 8B), a metal land pattern 28 is formed on the insulating or oxide layer 12 by standard evaporation or sputtering techniques to enable contact to the semiconductor surface. This is especially useful in forming either ohmic or rectifying contacts to a semiconductor surface with little possibility of forming undesired metal contacts to the semiconductor surface that could occur if the insulating layer 12 had undesired pinhole openings therein that were formed due to pinhole defects in a single photoresist or masking layer.

Referring to FIG. 2, a process is described for making electrical contact to a metal land located on an insulating layer formed on a substrate. This method of making electrical contact is particularly useful in either forming a terminal contact to a metal land which is in ohmic contact to a semiconductor region or in electrically interconnecting metal layers substantially separated by an insulating layer. Reference numbers used in FIG. 1 are used in FIG. 2 with the addition of the letter A to designate the same elements of the structure.

In step 1, an insulating layer 11 is formed on semiconductor substrate 10A by conventional techniques and a metal land 13 is formed on the insulating layer 11 by standard procedures or by the method described in steps 1 through 8B of FIG. 1. An insulating layer 12A is formed on the surface of the structure by either R.F. sputtering or other deposition techniques. Particularly useful insulating materials are R.F. sputtered glasses or silicates.

In step 2, a masking layer 14A is formed on the insulator layer 12A. The masking layer 14A is preferably a photoresist, such as Kodak Photoresist.

In step 3, an opening 16A is formed in the photoresist layer 14A as described in step 3 of FIG. 1.

In step 4, a second photoresist layer 18A is formed on the first photoresist layer 14A as described in step 4 of FIG. 1. The second photoresist layer has a recessed portion 20A located above the opening in the photoresist layer 14A which indicates the location of the opening that was previously formed therein.

In step 5, an opening 22A is formed in the first and second photoresist layers 14A and 18A, respectively, as described in step 5 of FIG. 1.

In step 6, (as in step 6 of FIG. 1), an opening 24A is etched in the insulating layer 12A using the double layers of photoresist 14A and 18A as masking layers.

In step 7, (as in step 7 of FIG. 1), the first and second photoresist layers 14A and 18A have been stripped away leaving the opening 24A in the insulating layer 12A.

Finally, in step 8, (as in step 8B of FIG. 1), a metal land or contact 28A is formed to electrically contact metal land 13. The land 28A can be formed by subtractive etching techniques, if desired. This process permits electrical contacts to be made that will probably not be shorted by pinhole openings in the insulating layer 12A.

Figure 3:
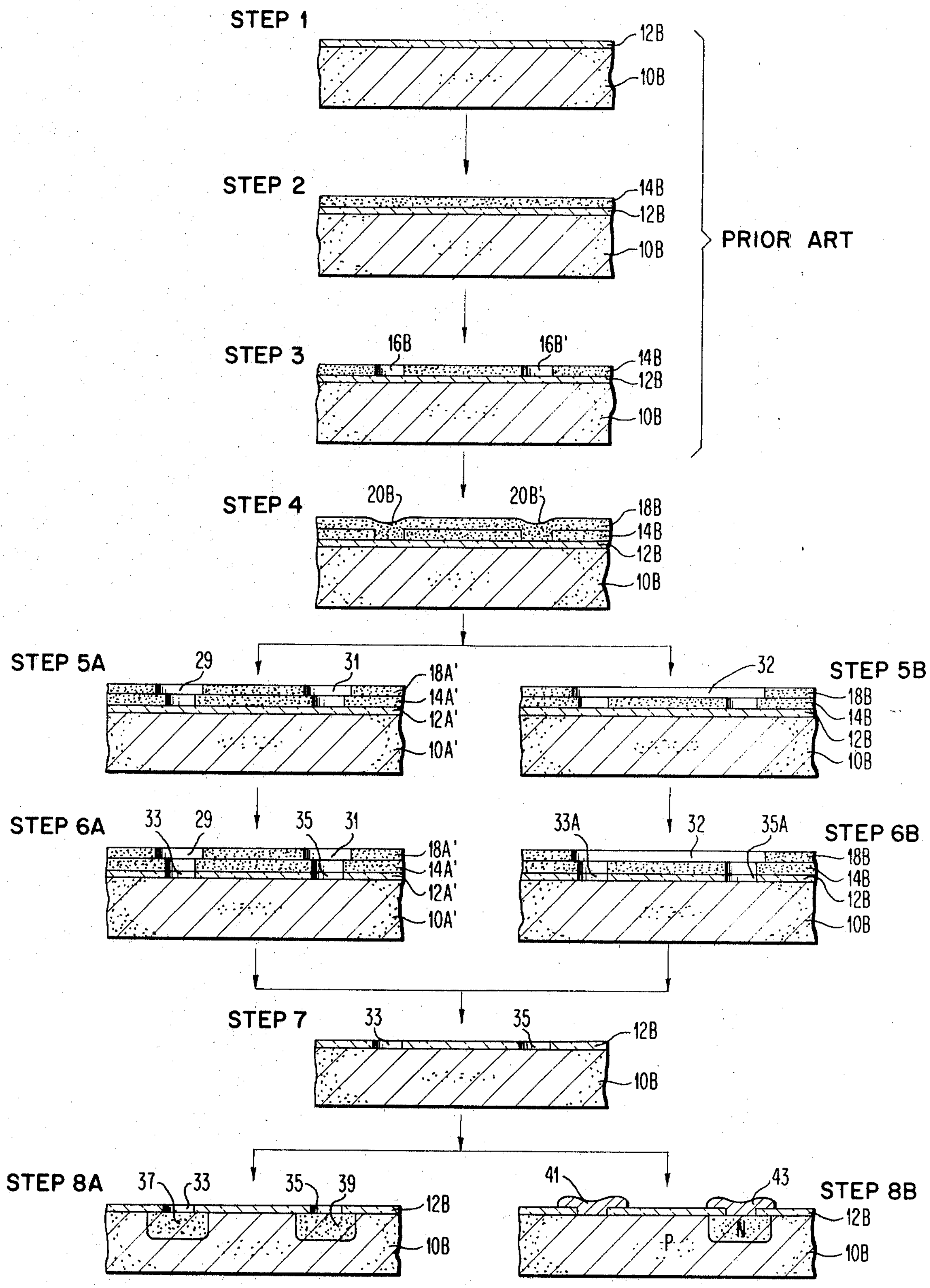
FIG. 3 is a flow diagram, in cross-section, of another embodiment of this invention showing alignment compensation in the steps for fabricating more than one opening in an insulating layer located on a semiconductor surface.

Referring to FIG. 3, a fabrication process is described similar to the process of steps 1 to 8A or 8B of FIG. 1. The same reference numerals used in FIG. 1 are used in FIG. 3 with the addition of the letter B to designate the same structural elements or features. Steps 1 and 2 of FIG. 3 are the same as steps 1 and 2 of FIG. 1.

In step 3, two openings 16B and 16B$^1$ are formed in the photoresist layer 14B by a standard photolithographic masking and exposing process as described in step 3 of FIG. 1. More openings can be used.

In step 4, a second photoresist layer 18B is formed on the first photoresist layer 14 by a conventional photoresist application operation. The second photoresist layer 18B has two recessed portions 20B and 20B$^1$, respectively, located above the region of the openings 16B and 16B$^1$ formed in the photoresist layer 14B.

Steps 5A and 6A illustrate one variation wherein openings 29 and 31 are formed in second photoresist layer 18A$^1$ which are larger than the openings in the first photoresist layer 14A$^1$ so as to facilitate alignment between the openings in the first and second photoresist layers. In step 6A, openings 33 and 35 are formed in insulating layer 12A$^1$ as described in step 6 of FIG. 1.

Steps 5B and 6B illustrate another variation wherein a single opening 32 is formed in the second photoresist layer 18B which encompasses both openings formed in the first photoresist layer 14B. This larger single opening 32 facilitates alignment between the openings in the first photoresist layer with the opening in the second photoresist layer. In step 6B, openings 33A and 35A are formed in the insulating layer 12B as described in step 6 of FIG. 1.

In step 7, the first and second photoresist layers have been stripped away (as described in step 7 of FIG. 1) thereby leaving openings 33 and 35 in the insulating layer 12B.

Step 8A is substantially the same as step 8A of FIG. 1, however, two diffused regions 37 and 39 are formed in the substrate 10B. For example, an FET device can be made in this way.

Step 8B is substantially the same as step 8B of FIG. 1, however, two ohmic contacts 41 and 43 are shown to be in electrical contact with a P-type (for example) substrate 10B and an N-type (for example) region.

It should be evident that a single opening can be formed in an insulating layer in accordance with the FIG. 3 embodiment. It should also be evident that the opening in the first masking layer can be larger than the opening in the second masking layer, however, the smaller opening determines the size of the opening that is formed in the insulating layer or film.

While the process described in FIGS. 1, 2 and 3 shows an opening being formed in the first masking layer, it is not necessary to actually form the opening in the first masking layer. If desired, a latent (or undeveloped) image formed on the first masking layer using the first mask (especially where the first masking layer is a layer of photoresist) serves to leave that region of the photoresist under the image unexposed. Hence, the subsequent formation of an opening in the second masking layer over the image in the first masking layer causes an aligned opening to be formed in the second and first masking layers.

In addition, only one photoresist or masking layer could be used instead of two photoresist layers provided that two different masks having the same pattern are used, in succession, to expose the surface of the single photoresist layer. In this example, mask defects in the first mask will leave unexposed a portion of the photoresist layer, however, upon the use of the second mask the undesired latent images on the photoresist formed by the defects of the first mask become exposed. Since defects in the second mask will statistically not line up with defects in the first mask, there will be no pinhole defects in the photoresist. Hence, the photoresist layer will not contain unexposed portions from the defects in the first or the second mask. This latter process will solve the problem associated with pinholes formed due to mask defects, however, since only one layer of photoresist is used, inherent defects in this layer will not be cured.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A method of forming an opening in an insulating film covering a semiconductor substrate without creating undesirable pinholes in said film comprising the steps of:

applying a first photoresist layer on the surface of said film;

forming a latent image on said first photoresist layer using a first mask;

applying a second photoresist layer on said first photoresist layer;

forming by using a second mask an opening in said second photoresist layer over said previously formed latent image on said first photoresist layer thereby creating an aligned opening, the opening in said second layer being larger than the opening in said first layer to facilitate said alignment through said second and said first photoresist layers; and forming an opening in said film through the opening formed in the second and first photoresist layers.

2. A method of forming an opening in an insulating film covering a semiconductor substrate without creating undesirable pinholes in said film comprising the steps of:

applying a first photoresist layer on the surface of said film;

forming an opening in said first photoresist layer using a first mask;

applying a second photoresist layer on said first photoresist layer;

forming an opening in said second photoresist layer over said previously formed opening in said first photoresist layer using a second mask, said opening in said second layer being larger than the opening in said first layer; and forming an opening in said film through the openings formed in the second and first photoresist layers.

3. A method in accordance with claim 2, wherein said film consists of an insulating material selected from the class consisting of silicon oxide, silicon nitride, alumina, germanium oxide and glass.

4. A method for forming at least one diffused region in an insulator coated semiconductor substrate comprising the steps of:

applying a first photoresist layer on the surface of said insulator coating;

forming at least one opening in said first photoresist layer using a first mask;

applying a second photoresist layer on said first photoresist layer;

forming at least one opening in said second photoresist layer over said previously formed opening in said first photoresist layer using a second mask, said opening in said second photoresist layer being larger than the opening in the first layer;

forming at least one opening in said insulator coating through the openings formed in the second and first photoresist layers; and diffusing impurities through said at least one opening in said insulator coating into said semiconductor substrate to form at least one diffused region.

5. A method in accordance with claim 4, wherein a single large opening in said second photoresist layer encompasses two smaller openings in said first photoresist layer.

6. A method for making at least one electrical contact to a semiconductor substrate coated with an insulator comprising the steps of:

applying a first photoresist layer on the surface of said insulator coating;

forming at least one opening in said first photoresist layer using a first mask;

applying a second photoresist layer on said first photoresist layer;

forming at least one opening in said second photoresist layer over said previously formed opening in said first photoresist layer using a second mask, said opening in said second photoresist layer being larger than the opening in the first layer;

forming at least one opening in said insulator coating through the openings formed in the second and first photoresist layers; and depositing a metal layer on said insulator coating to make at least one electrical contact to said structure through said at least one opening in said insulator coating.

7. A method in accordance with claim 6, wherein said structure being a metal land.

8. A method in accordance with claim 6, wherein a single large opening in said second photoresist layer encompasses two smaller openings in said first photoresist layer.

9. A method in accordance with claim 7, wherein a single large opening in said second photoresist layer encompasses two smaller openings in said first photoresist layer.

References Cited

UNITED STATES PATENTS

| | | | |
|---|---|---|---|
| 3,317,320 | 5/1967 | Reber | 96—36.2 |
| 3,075,866 | 1/1963 | Baker et al. | 156—13 |
| 3,185,568 | 5/1965 | Downie et al. | |

GEORGE F. LESMES, Primary Examiner

M. B. WITTENBERG, Assistant Examiner

U.S. Cl. X.R.

96—36, 38.4, 44